United States Patent
Coumou (10) Patent No.: US 10,910,197 B2
(45) Date of Patent: Feb. 2, 2021

(54) IMPEDANCE MATCHING NETWORK MODEL BASED CORRECTION SCHEME AND PERFORMANCE REPEATABILITY

(71) Applicant: MKS Instruments, Inc., Andover, MA (US)

(72) Inventor: David J. Coumou, Webster, NY (US)

(73) Assignee: MKS Instruments, Inc., Andover, MA (US)

( * ) Notice: Subject to any disclaimer, the term of this patent is extended or adjusted under 35 U.S.C. 154(b) by 35 days.

(21) Appl. No.: 16/164,892

(22) Filed: Oct. 19, 2018

(65) Prior Publication Data

US 2020/0126761 A1  Apr. 23, 2020

(51) Int. Cl.
  *H01J 37/32*  (2006.01)

(52) U.S. Cl.
  CPC .............................. *H01J 37/32183* (2013.01)

(58) Field of Classification Search
  CPC .................................................. H01J 37/32183
  See application file for complete search history.

(56) References Cited

U.S. PATENT DOCUMENTS

| 9,991,096 | B2 * | 6/2018 | Haga | ............... | H01J 37/32174 |
| 2012/0013416 | A1 | 1/2012 | Kim et al. | | |
| 2013/0187812 | A1 | 7/2013 | Nero, Jr. et al. | | |
| 2016/0336916 | A1 | 11/2016 | Du Toit et al. | | |
| 2019/0036507 | A1 * | 1/2019 | Oshida | .................... | H05H 1/46 |
| 2019/0108976 | A1 | 4/2019 | Van Zyl | | |

FOREIGN PATENT DOCUMENTS

| KR | 20180103141 A | 9/2018 |
| WO | WO-2017-161641 A1 | 9/2017 |

OTHER PUBLICATIONS

International Search Report and Written Opinion of the International Searching Authority for PCT Patent App. No. PCT/US2019/056759, dated Feb. 7, 2020.

* cited by examiner

*Primary Examiner* — Samuel S Outten
(74) *Attorney, Agent, or Firm* — Harness, Dickey & Pierce, P.L.C.

(57) ABSTRACT

A matching network system for a radio frequency (RF) power delivery system includes a matching network having a variable tuning element. The matching network introduces a variable impedance between a RF power generator and a load. A stepper motor adjusts a position of the variable tuning element. The matching network system also includes a controller communicating with the matching network. The controller receives the position of the stepper motor and compares the position with a stored, predetermined position. The controller generates a position correction and applies the position correction to the position to provide improved repeatability or reproducibility.

19 Claims, 6 Drawing Sheets

IMPEDANCE MATCHING NETWORK MODEL BASED CORRECTION SCHEME AND PERFORMANCE REPEATABILITY

FIELD

The present disclosure relates to matching networks for RF generator systems and to control systems for matching networks in RF generator control systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network, and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

Some semiconductor device fabrication systems utilize multiple plasma chambers in order to increase the production volumes of semiconductor devices. In such systems, the matching network associated with each plasma chamber of the semiconductor device fabrication system can impact the uniformity of the semiconductor devices being produced across the multiple plasma chambers. While matching network control systems enable a certain measure of uniformity across multiple plasma chambers, the continually increasing need for smaller components and increased yields demand continual improvement over the present configurations.

SUMMARY

Further areas of applicability of the present disclosure will become apparent from the detailed description, the claims and the drawings. The detailed description and specific examples are intended for purposes of illustration only and are not intended to limit the scope of the disclosure.

A matching network for a radio frequency (RF) power delivery system includes at least one variable tuning element. A matching network also includes a stepper motor for displacing the variable tuning element. The stepper motor is configured to adjust the variable tuning element so that each adjustment step of the stepper motor causes a constant change in a reactance of the matching network.

A matching network system for a radio frequency (RF) power delivery system includes a matching network having a variable tuning element. The matching network introduces a variable impedance between a RF power generator and a load. A stepper motor adjusts a position of the variable tuning element. The matching network system also includes a controller communicating with the matching network. The controller receives the position of the stepper motor and compares the position with a stored, predetermined position. The controller generates a positon correction and applies the position correction to the position.

A control system for a matching network includes a processor and a memory. The memory stores instructions executable by the processor. The instructions executed by the processor are configured to adjust a stepper motor to displace a variable tuning element. The stepper motor adjusts the variable tuning element according to an adjustment step of the stepper motor and causes a constant change in a reactance of the matching network, the stepper motor defines a correction model for the matching network, wherein for a predetermined reactance of the matching network, a position correction is applied in accordance with the predetermined reactance.

A method for adjusting a matching network includes providing a stepper motor and adjusting the stepper motor to displace a variable tuning element. The method also includes determining a position of the variable tuning element according to at least one of each adjustment step of the stepper motor causes a constant change in a reactance of the matching network or, applying a correction model for the matching network. For the correction model, for a predetermined reactance of the matching network, a position correction is applied in accordance with the predetermined reactance.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In the RF power source or supply field, there are typically two approaches to applying the RF signal to the load. A first, more traditional approach is to apply a continuous wave signal to the load. In a continuous wave mode, the continuous wave signal is typically a sinusoidal wave that is output continuously by the power source to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In a typical RF power supply configuration, output power applied to the load is determined using sensors that measure the forward and reflected power or the voltage and current of the RF signal applied to the load. Either set of these signals is analyzed in a control loop. The analysis determines a power value which is used to adjust the output of the RF power supply in order to vary the power applied to the load. In a RF power delivery system, where the load is a plasma chamber, the varying impedance of the load causes a corresponding varying power applied to the load, as applied power is in part a function of the impedance of the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias power and a source power applied to one or a plurality of electrodes. The source power typically generates the plasma, and the bias power tunes the plasma to an energy relative to the bias RF power supply. The bias and the source may share the same electrode or may use separate electrodes, in accordance with various design considerations.

When a RF power delivery system drives a load in the form of a plasma chamber, the electric field generated by the power delivered to the plasma chamber results in ion energy within the chamber. One characteristic measure of ion energy is the ion energy distribution function (IEDF). The ion energy distribution function (IEDF) can be controlled with a RF waveform. One way of controlling the IEDF for a system in which multiple RF power signals are applied to the load occurs by varying multiple RF signals that are related by frequency and phase. The frequencies between the multiple RF power signals are locked, and the relative phase between the multiple RF signals is also locked. Examples of such systems can be found with reference to U.S. Pat. Nos. 7,602,127, 8,110,991, and 8,395,322, assigned to the assignee of the present invention and incorporated by reference in this application.

RF plasma processing systems include components for plasma generation and control. One such component is referred to as a plasma chamber or reactor. A typical plasma chamber or reactor utilized in RF plasma processing systems, such as by way of example, for thin-film manufacturing, utilizes a dual frequency system. One frequency (the source) of the dual frequency system controls the generation of the plasma, and the other frequency (the bias) of the dual frequency system controls ion energy. Examples of dual frequency systems include systems that are described in U.S. Pat. Nos. 7,602,127; 8,110,991; and 8,395,322 referenced above. The dual frequency system described in the above-referenced patents requires a closed-loop control system to adapt RF power supply operation for the purpose of controlling ion density and its corresponding ion energy distribution function (IEDF).

Multiple approaches exist for controlling a plasma chamber for generating plasmas. For example, phase and frequency of the driving RF signals may be used to control plasma generation. For RF driven plasma sources, the periodic waveform effecting plasma sheath dynamics and the corresponding ion energy is generally known and the frequency of the periodic waveforms and the associated phase interaction. Another approach involves dual frequency operation. That is, two RF frequency sources are used to power a plasma chamber to provide substantially independent control of ion and electron densities.

Another approach utilizes wideband RF power sources to drive a plasma chamber, but includes certain difficulties. One difficulty is coupling the power to the electrode. A second difficulty is that the transfer function of the generated waveform to the actual sheath voltage for a desired IEDF must be formulated for a wide-process space to support material surface interaction. In yet another approach, in an inductively coupled plasma, controlling power applied to a source electrode controls the plasma density while controlling power applied to the bias electrode controls the IEDF to provide etch rate control. By using source electrode and bias electrode control, the etch rate is controlled via the ion density and energy.

Figure 1:
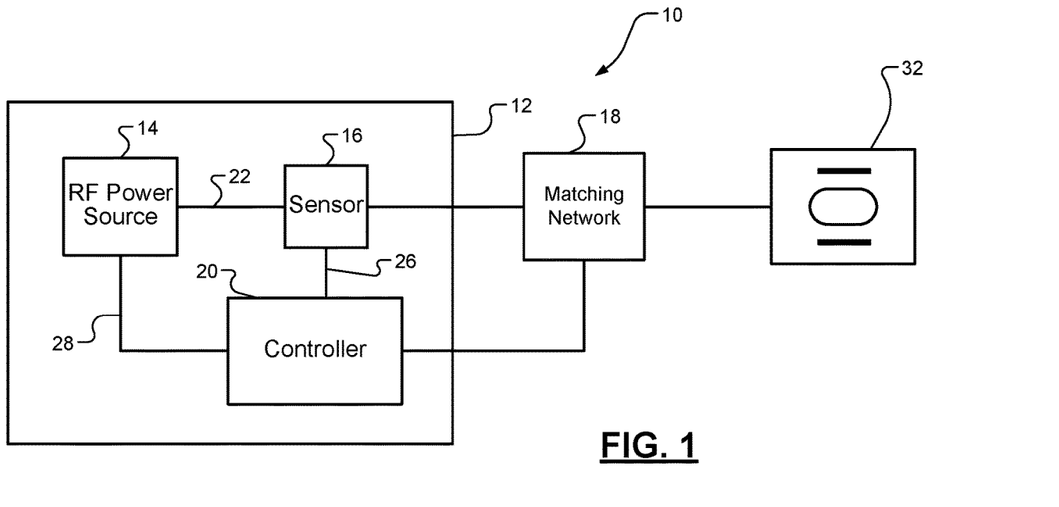
FIG. 1 is a schematic block diagram of a RF generator system arranged in accordance with various embodiments.

FIG. 1 depicts a RF generator or power supply system 10 arranged according to various embodiments. Power supply system 10 includes a radio frequency (RF) generator or power supply 12, match or matching network 18, and load or plasma chamber 32. In various embodiments, RF generator 12 is referred to as a source RF generator, and matching network 18 is referred to as a source matching network. It will be understood that in various embodiments, RF generator 12 may be referred to as a source or bias RF generator, and matching network 18 may be referred to as a respective source or bias matching network.

RF generator 12 includes a RF power source or amplifier 14, RF sensor 16, and processor, controller, or control module 20. RF power source 14 generates a RF power signal 22 output to sensor 16. Sensor 16 receives the output of RF power source 14 and generates respective RF power signals to match or matching network 18. Sensor 16 also outputs signals that vary in accordance with various parameters sensed from load 32. While sensor 16 is shown within RF generator 12, in various embodiments RF sensor 16 can be located externally to the RF power generator 12. Such external sensing can occur at the output of the RF generator, at the input of an impedance matching device located between the RF generator and the plasma chamber, or between the output of an impedance matching circuit (including, inside the impedance matching device) and the plasma chamber.

Sensor 16 detects operating parameters of RF power source 14 and plasma chamber 32, and outputs signal 26. Sensor 16 may include voltage, current, and/or directional coupler sensors. Sensor 16 may detect (i) voltage V and current I and/or (ii) forward (or source) power $P_{FWD}$ output from power amplifier 14 and/or RF generator 12 and reverse (or reflected) power $P_{REV}$ received from respective matching network 18 or load 32 connected to sensor 16. The voltage V, current I, forward power $P_{FWD}$, and reverse power $P_{REV}$ may be scaled and/or filtered versions of the actual voltage, current, forward power, and reverse power associated with the power source 14. Sensor 16 may be an analog and/or digital sensor. In a digital implementation, the sensor 16 may include analog-to-digital (ND) converters and signal sampling components with corresponding sampling rates. Signal 26 can include a pair of signals X and Y, which can represent any of the voltage V and current I or forward (or source) power $P_{FWD}$ reverse (or reflected) power $P_{REV}$.

Sensor 16 generates sensor signals X, Y, which are received by controller or power control module 20. Power control module 20 processes signal 26 and generates one or a plurality of feedback control signals 28 to power source 14. RF power source 14 adjusts the RF power signal 22 based on the received feedback control signal. Power control module 20 may include, proportional integral derivative (PID) controllers or subsets thereof and/or direct digital synthesis (DDS) component(s) and/or any of the various components described below in connection with the term modules. In various embodiments, power control module 20 is a first PID controller or subset and may include functions, processes, processors, or submodules. Feedback control signal 28 may be a drive signal and have a DC offset or rail voltage, voltage or current magnitude, a frequency, and a phase.

In various embodiments, RF power source 14, sensor 16, controller 20, and matching network 18 can be referred to as source RF power source 14, source sensor 16, source controller 20, and source matching network 18. Similarly in various embodiments, RF power source 14, sensor 16, controller 20, and matching network 18 can be referred to as bias RF power source 14, bias sensor 16, bias controller 20, and bias matching network 18. In various embodiments and as described above, source refers to a RF generator that generates the plasma, and bias refers to a RF generator that tunes the plasma Ion Energy Distribution Function (IEDF) relative to the bias RF power supply. In various embodiments, the source and bias RF power supplies operate at different frequencies. In various embodiments, the source RF power supply operates at a higher frequency than the bias RF power supply.

For semiconductor device fabrication, nodes continue to shrink to provide greater density with higher performance commensurate with smaller die area. High-volume manufacturing has additionally adopted scaling along the height axis to take advantage of volume over area for three dimensional devices. Further, manufacturers continue to adopt tighter process control limits to achieve new node production rates at yields of the previous node. As a result, semiconductor manufacturers have adopted a plasma chamber matching initiative to ensure that productivity remains at desirable economic levels. Manufacturers enforce this objective by applying tighter process control limits.

The chamber matching initiative has several objectives, including improving tune repeatability of a matching network. Another objective is improving tune reproducibility of a matching network. Another objective is responding to customer demands for increased tool matching for fabrication processes using multiple plasma chambers. Yet another objective is optimizing reflected power across multiple matching networks for each chamber in a cluster of tools. Yet another objective is realizing repeatable results from a matching network for a given tune position. Yet another objective is reducing production qualifications through the procurement hierarchy. Yet another objective is reducing variability across a fleet of tools. Yet another objective is maintaining high factory yield and output, as double patterning has transitioned to quadruple patterning and requires more stringent process controls. While in earlier systems, one typical goal was to match chamber results to within 5% of each other, one objective with advanced nodes is to match to within ½σ-1σ of the mean of the selected, ideal chamber—typically on the order of a few angstroms. Thus, chamber matching within the RF domain is critical.

One current approach to providing improved reproducibility between impedance matching networks involves the use of tuneable padder capacitors placed both in series and in parallel with respective tune and load capacitors. Padder capacitors, however, add cost to the match network and complexity during manufacturing.

The impedance matching network model of the various embodiments improves tune repeatability and tune reproducibility by varying the tuning steps of variable reactance elements, such as capacitors in the matching network to operate in optimal regions of the matching network tune space. For tune repeatability, another aspect of the design creates, for the tune and load capacitors, a relationship so that each step of adjustment of the capacitors results in a uniform change in the reactance of the matching network. For tune reproducibility, one aspect of the design generates a characterization using a least squares approximation for the tune and load capacitors at the time of manufacture.

Figure 2:
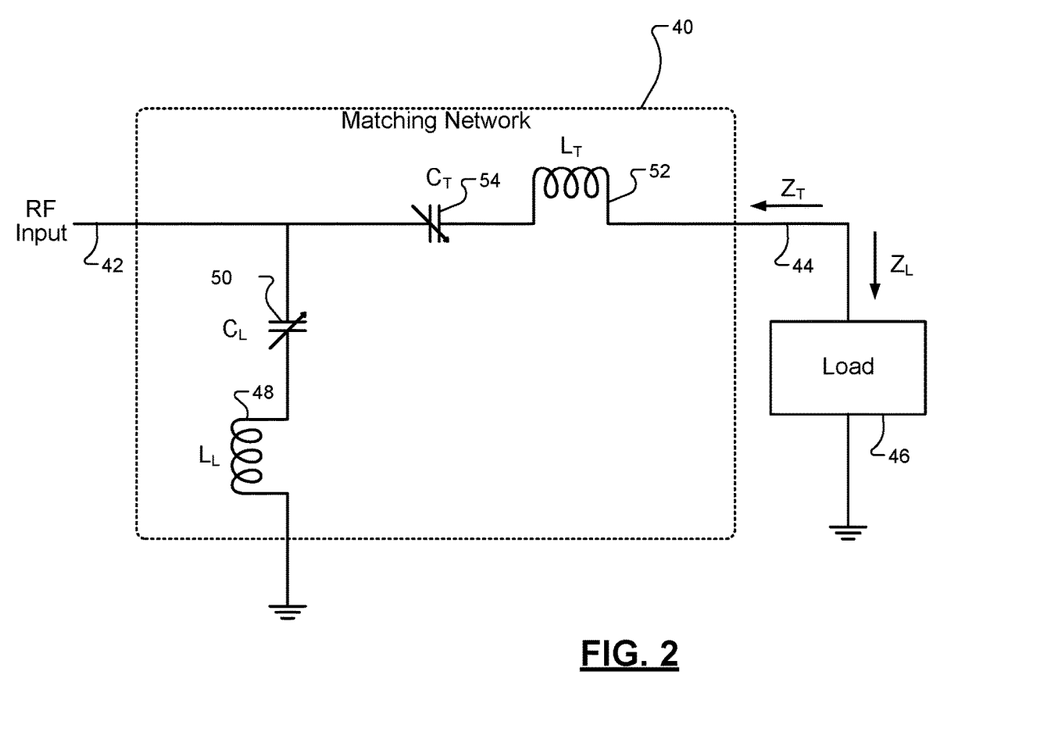
FIG. 2 is a schematic block diagram of a matching network and a load, including an expanded view of the matching network.

FIG. 2 depicts a schematic block diagram of a matching network 40 receiving a RF input signal 42 and generating an output 44 to a load 46. Matching network 40 includes a load leg having a load inductor $L_L$ 48 and a load capacitor $C_L$ 50. In various embodiments, matching network 40 and load 46 correspond to respective matching network 18 and load 32 of FIG. 1, with RF generator 12 generating RF input signal 42. Matching network 40 also includes a tune leg having a tune inductor $L_T$ 52 and a tune capacitor $C_T$ 54. The schematic block diagram of FIG. 2 also shows representative impedances including a load impedance $Z_L$ and a tune impedance $Z_T$. The load capacitor $C_L$ 50 and the tune capacitor $C_T$ 54 are variable capacitors and are adjustable to vary the respective load impedance and tune impedance in order to provide a suitable match between the RF generator supplying (such as 12 of FIG. 1) the RF input and the load 46.

Figure 3:
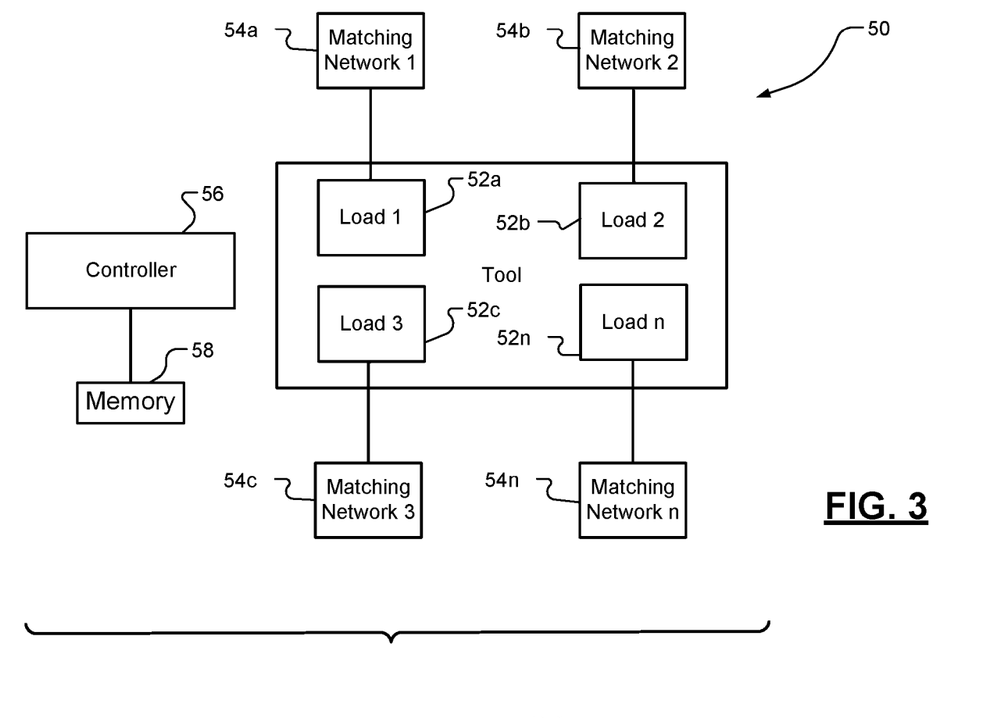
FIG. 3 is a schematic block diagram of a multi-plasma chamber tool having multiple matching networks and loads.

FIG. 3 depicts a schematic block diagram of a semiconductor fabrication tool system 50 including a plurality of loads 52a, 52b, 52c, . . . , 52n, such as plasma chambers or other semiconductor fabrication devices. Each load is connected to a RF generator, such as RF generator system 10, although only the matching networks 54a, 54b, 54c, . . . , 54n are shown in FIG. 3. Each matching network 54a, 54b, 54c, . . . , 54n connects to respective loads 52a, 52b, 52c, . . . , 52n. In various embodiments, each respective matching network 54 can be controlled in accordance with the teaching of the present disclosure. For example, each matching network 54 can be configured to facilitate chamber matching in order to reduce variability across the fleet of matching network 52/loads 52 combinations. FIG. 3 also includes a controller 56 which fabricates processes for chamber matching by communicating with matching networks 54 for centralized control, or, by way of non-limiting example, controller 20 of FIG. 1 in order to centralize control of matching networks 54.

Figure 4:
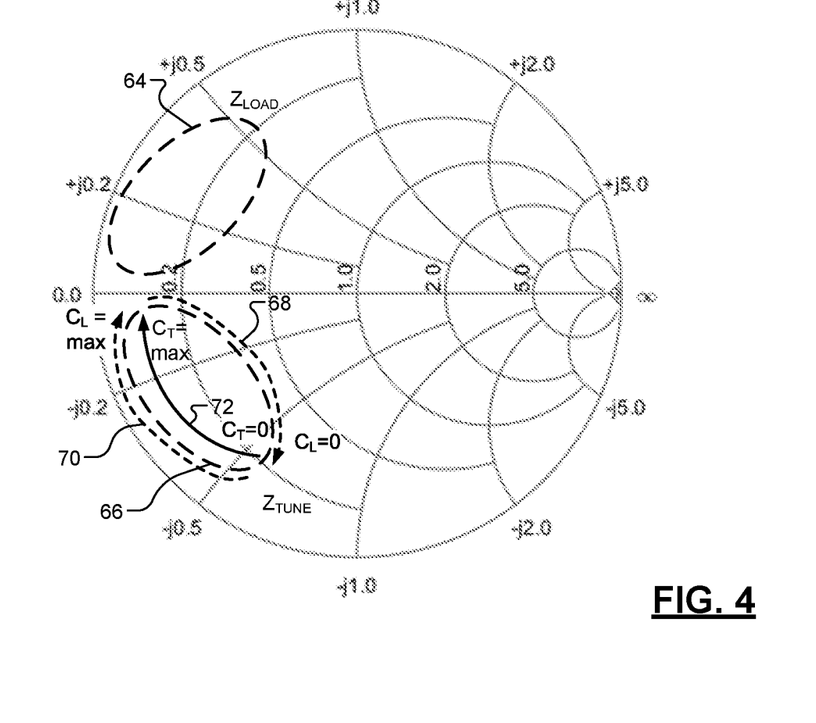
FIG. 4 is an example of a Smith chart showing a load and tune space for a matching network.

FIG. 4 depicts a Smith chart showing an exemplary load space $Z_{LOAD}$ 64 and tune space $Z_{TUNE}$ 66. Tune space $Z_{TUNE}$ 66 is a conjugate of load space $Z_{LOAD}$ 64. In various scenarios, a customer may provide information for load space $Z_{LOAD}$ 64. As can be seen in FIG. 4, traversing the periphery of tune space $Z_{TUNE}$ 66 from the upper left to the lower right in a clockwise direction along path 68 indicates a change in the load capacitance $C_L$ from a maximum capacitance to a minimum capacitance. Likewise, traversing the periphery of tune space $Z_{TUNE}$ 66 from the lower right to the upper left in a clockwise direction along 70 indicates a change in the load capacitance $C_L$ from a minimum capacitance to a maximum capacitance. As the position of the variable capacitor changes, the circuit impedance varies due to the reactance change associated with the change in capacitance, as can be seen in the trajectory of paths 68, 70, and 72 in the Smith chart of FIG. 4. Similarly path 72 within tune space $Z_{TUNE}$ 66 indicates a change in the tune capacitance $C_T$ from a minimum to a maximum tune capacitance.

In the Smith chart of FIG. 4, it can be seen that there are areas of tune space $Z_{TUNE}$ 66 where changes in position have a greater impact on the respective load impedance $Z_L$ and tune impedance $Z_T$, that is $$\frac{dZ_L}{dP_L} \text{ and } \frac{dZ_T}{dP_T},$$

respectively. Likewise, there are areas of tune space $Z_{TUNE}$ 66 where changes in position have a lesser impact on the load impedance $Z_L$ and the tune impedance $Z_T$.

The nonuniformity in the change of impedance with respect to the change of position in the matching network tune space presents challenges to uniform control. The end-user develops statistical process control (SPC) limits based on the matching network position. Since impedance sensitivity with respect to position varies based on where the capacitance is in the tune space, SPC can be inconsistent. For example, in the lower quadrant of the tune space $Z_{TUNE}$ 66, not only does positional accuracy suffer due to numerical range, but the reactance resolution is poor. This creates a challenge to meeting lower percentage SPC limits. Control of stepper motors that adjust $C_L$ and $C_T$ has an accuracy of ½, ¼, ⅛, and 1/16 turns of the stepper motor. Thus, it is desirable to provide control that allows higher motor stepper resolution in the lower quadrant of the tune space and a reduced resolution as the motor steps increase. Such control will enable a more uniform change in impedance with respect to change of position across the entire tune space. Such uniformity will provide greater repeatability in implementation of the match network.

Figure 5:
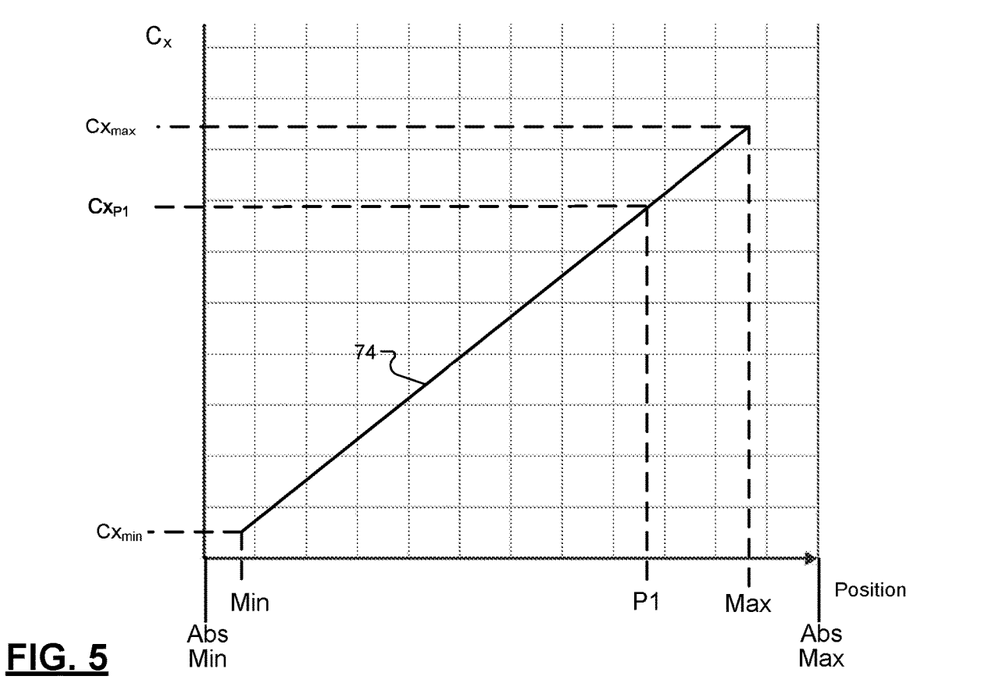
FIG. 5 is a plot of an idea L relationship between a tuned position of a variable capacitor and the corresponding capacitance.

FIG. 5 provides an example of an ideal, uniform relationship between position of a variable capacitor and capacitance of the controlled capacitor. As can be seen in FIG. 5, the relationship between position of the capacitor and capacitance is uniform. That is, a change in position results in a uniform or linear change in capacitance. This relationship addresses the repeatability of control for capacitors in a matching network. In FIG. 5, the plot depicts the position of a variable capacitor between an absolute minimum Abs Min and an absolute maximum Abs Max. In various configurations, a variable capacitor cannot obtain the absolute minimum or maximum values. Therefore, plot 74 includes a position Min as a minimum and a position Max as a maximum and the position of the variable capacitor depicted by plot 74 varies between Min and Max. The capacitance of variable capacitor at position Min is $Cx_{Min}$. Likewise, the position of variable capacitor at position Max is $Cx_{Max}$. With respect to a particular position P1 to Min and Max, the output is $Cx_{P1}$. The capacitance plot 74 of FIG. 5 depicts an ideal variable capacitor in which the capacitance varies linearly, with respect to the position.

Figure 6:
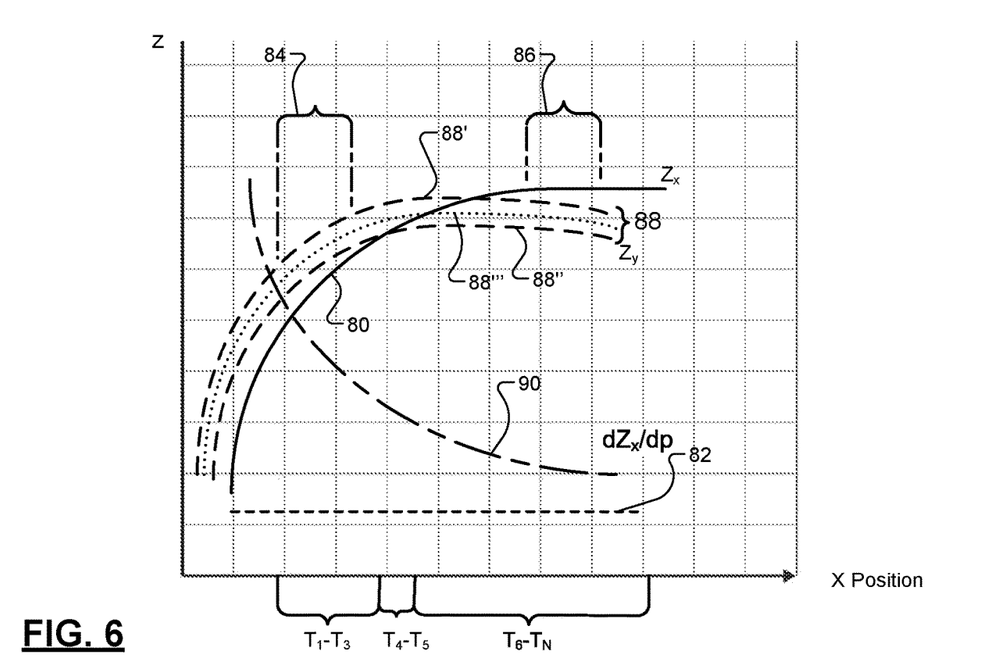
FIG. 6 depicts a relationship between a tuning position for a capacitor and a matching network versus the reactance of the capacitor.

One approach to improve repeatability and uniformity of a matching network can be seen with respect to FIG. 6. In FIG. 6, the x-axis depicts position of an example capacitor, which may be the load capacitor $C_L$ or the tune capacitor $C_T$ shown in FIG. 2. The y-axis represents impedance Z. In FIG. 6, a first waveform 80 represents the impedance $Z_x$ of the matching network with respect to the position X of a variable reactance element, such as a capacitor. FIG. 6 depicts an area of poor resolution 84 in $Z_x$ in which $Z_x$ has a substantial vertical component where a small change in position X results in a large change in impedance $Z_x$. FIG. 6 also depicts an area of desirable resolution 86 in $Z_x$ in which $Z_x$ has a substantially horizontal component where a small change in position X results in a corresponding small change in impedance $Z_x$, thereby providing uniformity in curve of impedance $Z_x$ with respect to position X.

In addition to impedance curve $Z_x$, FIG. 6 depicts impedance curves $Z_y$ 88 for one of the tune leg or load leg of the matching network, where $Z_y = Z_x + Z_{LX}$, where $Z_{LX}$ is the reactance of the inductive component in the respective leg of the matching network. A similar set of curves exist for the other of the tune leg or the load leg of the matching network. One or both legs of a matching network can be controlled using the approaches described in this specification. FIG. 6 also depicts a waveform 82 which indicates a theoretical, ideal relationship between a change of position X and a corresponding change in impedance Z, $$\frac{dZ_x}{dp}.$$

As can be seen in FIG. 6, the ideal relationship suggests a linear relationship in which, for a given change in position X, the corresponding change in impedance Z remains substantially the same. FIG. 6 also depicts curves $$\frac{dZ_x}{dp} \; 90$$

in addition to ideal curve $$\frac{dZ_x}{dp} \; 82.$$

The curve $Z_y$ 88 indicates the variability of the impedance with respect to positon and the reactance of the capacitor. Therefore, impedance curve $Z_y$ 88 is indicated as a band of impedances within a range of impedance curves 88', 88", including a median impedance curve 88'''. The curve $$\frac{dZ_x}{dp} \; 90$$

indicates the derivative of the impedance $Z_x$ 80 with respect to position X. As can be seen, $$\frac{dZ_x}{dp} \; 90$$

is higher for steeper sections of $Z_x$ 80, such as section 84 of $Z_x$, and lower for the flatter sections, such as section 86 of $Z_x$. This indicates that the impedance changes less for a given change in position X, as X increases. The ideal curve $$\frac{dZ_x}{dp} \; 82$$

indicates that in a preferred implementation, $$\frac{dZ_x}{dp} \; 82$$

is linear and horizontal so that regardless of the position of the tune or load capacitors, the impedance Z changes an equal amount in response to a change in the position X.

FIG. 6 also indicates that the x-axis position can be characterized by the number of turns of the stepper or servo motor that adjusts the variable reactive element to position X. Impedance curve $Z_y$ 88 is subdivided by the number of turns that cover a particular range of impedance curve $Z_y$ 88. For example, turns one-three $T_1$-$T_3$ define one band of the positions X of the stepper motor. The band defined by $T_1$-$T_3$ corresponds to an area of the impedance curve $Z_y$ 88 in which a small change in X yields a relatively large change in $Z_y$. Similarly, turns $T_4$-$T_5$ define a second band of the position X of the stepper motor. The band defined by $T_4$-$T_5$ corresponds to an area of the impedance curve $Z_y$ 88 in which a small change in X yields a lesser change in $Z_y$ 88 than for band $T_1$-$T_3$. Turns $T_6$-$T_n$ define a third band of the position X of the stepper motor. The band defined by $T_6$-$T_n$ corresponds to an area of the impedance curve $Z_y$ 88 in which a small change in X yields a generally small, uniform change in $Z_y$ 88. It should be recognized that T refers to full turns, but as described above, in a typical configuration, the stepper motors have an accuracy of 1, ½, ¼, ⅛, and 1/16 steps for a given change in position X.

Figure 7:
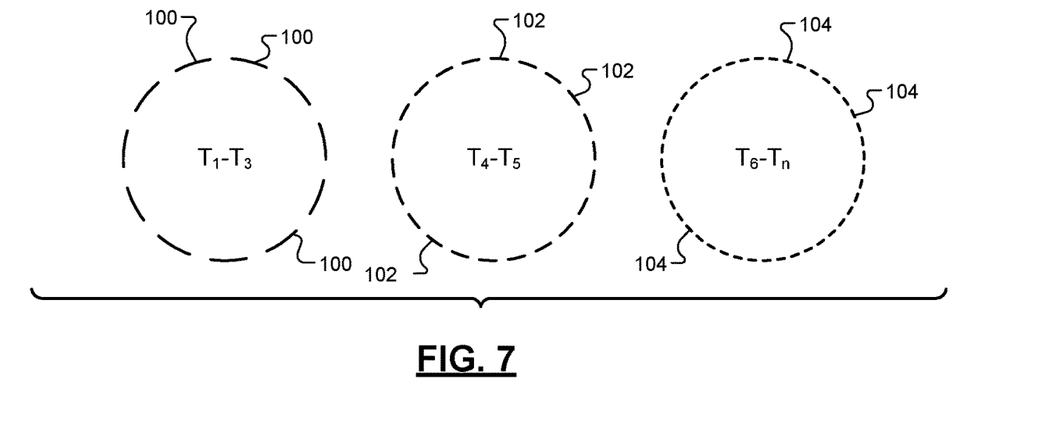
FIG. 7 is a diagrammatic representation of change in capacitance relative to change in position for various portions of a range of turns for a capacitor in a matching network.

FIG. 7 provides a visual representation of the change in impedance $Z_y$ 88 for a given change in position X. In various embodiments, 200 full steps complete one turn of a stepper motor. Similarly, 400½ steps complete one full turn of a stepper motor, and 800¼ steps, 1600⅛ steps, or 3200 1/16 steps complete one full turn of a stepper motor. The length of a segment of the circle corresponds to the change in $Z_y$ 88 for a given change in position X. As can be seen in FIG. 7, turns $T_1$-$T_3$ show a greater change in impedance $Z_y$ 88, as indicated by segments 100. Note that reference number 100 can refer to all segments of circle $T_1$-$T_3$. Similarly, $T_4$-$T_5$ shows a lesser change in impedance $Z_y$ 88 for a given change in position X, than for circuit $T_1$-$T_3$. Segments 102 defining $T_4$-$T_5$ thus indicate that for a given change of position in the range of $T_4$-$T_5$ for a variable reactive element, such as a capacitor, the impedance $Z_y$, indicated by segments 102, is less than a change of $Z_y$ 88 for circle $T_1$-$T_3$, as indicated by segments 100. That is, a capacitor has an improved impedance resolution for turns $T_4$-$T_5$ than for turns $T_1$-$T_3$. Although only three segments are labeled in circle $T_4$-$T_5$, it will be understood that each segment can be referred to as segment 102. Similarly, circle $T_6$-$T_n$ indicates that a relatively small change in the position X results in a relatively small change in impedance $Z_y$ 88, as indicated by segments 104. That is, a capacitor has further improved impedance resolution for turns $T_6$-$T_n$. Similarly, as described above, any of the segments of circle $T_6$-$T_n$ can be referred to as segment 104.

From FIGS. 6 and 7, it can be seen that uniformity and repeatability can be achieved by applying smaller steps to the $T_1$-$T_3$ band, such as ⅛ or 1/16 steps, for example. For band $T_6$-$T_n$, uniformity and repeatability can be achieved by applying larger steps, such as ½ or 1 steps, for example. Further, FIG. 7 can be used to characterize a matching network in variable reactance steps that remain constant. That is, constant reactance steps are determined by assigning potentially unequal displacement of the variable capacitor between each step. The number of steps are determined based on equal reactance changes between each adjustment step.

By way of non-limiting example, Table 1 below depicts the relationship between the available steps $S_1, \ldots, S_{15}$ and the reactance in the various bands of the position of a variable capacitive element in one of the tune or load legs of a match network.

TABLE 1

| Steps | $T_1$-$T_3$ Reactance | $T_4$-$T_5$ Reactance | $T_6$-$T_n$ Reactance |
|---|---|---|---|
| $S_0$ | $Z_y = r$ | N/A | $10Z_y$ |
| $S_1$ | $2Z_y$ | $5Z_y$ | N/A |
| $S_2$ | N/A | N/A | N/A |
| $S_3$ | N/A | N/A | $11Z_y$ |
| $S_4$ | N/A | N/A | N/A |
| $S_5$ | N/A | $6Z_y$ | N/A |
| $S_6$ | N/A | N/A | $12Z_y$ |
| $S_7$ | $3Z_y$ | N/A | N/A |
| $S_8$ | N/A | N/A | N/A |
| $S_9$ | N/A | $7Z_y$ | $13Z_y$ |
| $S_{10}$ | N/A | N/A | N/A |
| $S_{11}$ | $4Z_y$ | N/A | N/A |
| $S_{12}$ | N/A | $8Z_y$ | $14Z_y$ |
| $S_{13}$ | N/A | N/A | N/A |
| $S_{14}$ | N/A | N/A | N/A |
| $S_{15}$ | N/A | $9Z_y$ | $15Z_y$ |

Table 1 includes step changes for turns $T_1$-$T_3$ in one column, $T_4$-$T_5$ in a second column, and $T_6$-$T_n$ in a third column. In the first column, referred to as Steps, 16 steps are shown covering a portion of or the entirety of the turn range, by way of example. One skilled in the art will recognize, however, that the step may be full steps, ½ steps, ¼ steps, ⅛ steps, or 1/16 steps. The Steps column of Table 1 shows 16 steps as $S_0$-$S_{15}$, by way of example, for each of the bands.

In column $T_1$-$T_3$ Reactance, $Z_y$ is shown as an initial reactance, such as a selected $Z_y$ of FIG. 6. At step S0 in column $T_1$-$T_3$ Reactance, $Z_y$ is an initial reactance. As can be seen in column $T_1$-$T_3$ Reactance, the steps are chosen to indicate constant reaction steps $Z_y$, $2Z_y$, $3Z_y$, $4Z_y$ at respective steps $S_0$, $S_1$, $S_7$, and $S_{11}$. The intermediate steps $S_2$-$S_6$, $S_8$-$S_{10}$, $S_{12}$-$S_{15}$ are N/A to indicate that these steps are not used because they do not provide constant and uniform changes to reactance. Likewise, column $T_4$-$T_5$ Reactance shows increasing reactance steps $5Z_y$, $6Z_y$, $7Z_y$, $8Z_y$, and $9Z_y$ at respective steps $S_1$, $S_5$, $S_9$, $S_{12}$, and $S_{15}$. The other positions $S_0$, $S_2$-$S_4$, $S_6$-$S_8$, $S_{10}$, $S_{11}$, $S_{13}$, and $S_{14}$ are indicated as N/A as these positions are not used because they do not provide constant and uniform reactance changes when moving from a first position to a second position. Likewise, column $T_6$-$T_n$ Reactance shows a continuing, uniform, and constant increase in reactance at $10Z_y$, $11Z_y$, $12Z_y$, $13Z_y$, $14Z_y$, and $15Z_y$ at steps $S_0$, $S_3$, $S_6$, $S_9$, $S_{12}$, and $S_{15}$, respectively, for that turn range.

One skilled in the art will recognize that steps $S_0$-$S_{15}$ may differ in magnitude for each column $T_1$-$T_3$ Reactance, $T_4$-$T_5$ Reactance, and $T_6$-$T_n$ Reactance, respectively. For example, steps $S_0$-$S_{15}$ may refer to ⅟₁₆ or ⅛ steps with respect to column $T_1$-$T_3$ Reactance, while steps $S_0$-$S_{15}$ may refer to ¼ or ½ steps with respect to column $T_4$-$T_5$ Reactance. Likewise, steps $S_0$-$S_{15}$ with respect to column $T_6$-$T_n$ Reactance may refer to ½ or full steps. One skilled in the art will further recognize that a particular relevance with respect to Table 1 is that reactance across columns $T_1$-$T_3$ Reactance through $T_6$-$T_n$ Reactance increases uniformly by $Z_y$=r across the range of turns from $Z_y$ through $15Z_y$. One skilled in the art will further recognize that although a number of intermediate steps are available, the intermediate steps that do not provide a constant, uniform change in reactance are unavailable.

In addition to repeatability provided by uniformity across the tune space, a challenge of reproducibility also exists. The present disclosure discusses model correction to improve reproducibility between two matching networks. A correction to the matching network actuator, such as a stepper motor, motor set position is applied to provide a global model to operate as similarly to an ideal capacitor. A tuning approach will drive the capacitor towards a position to achieve maximum power delivery at 0 Watts of reflected power. The position reported is corrected to the global model. It should be noted, however, that the implementation does not correct capacitance, but reactance for the particular (tune or load) leg of the circuit. The correction separates the series (load) and shunt (tune) legs and characterizes the reactance range over the position range as measured by a network analyzer. A least squares approximation corrects the variation of the actual reactance to stepper motor position to the global model. This will assure matching to matching network repeatability and enhanced chamber matching as each matching would report tuning positions with similar values for the same local condition.

Figure 8:
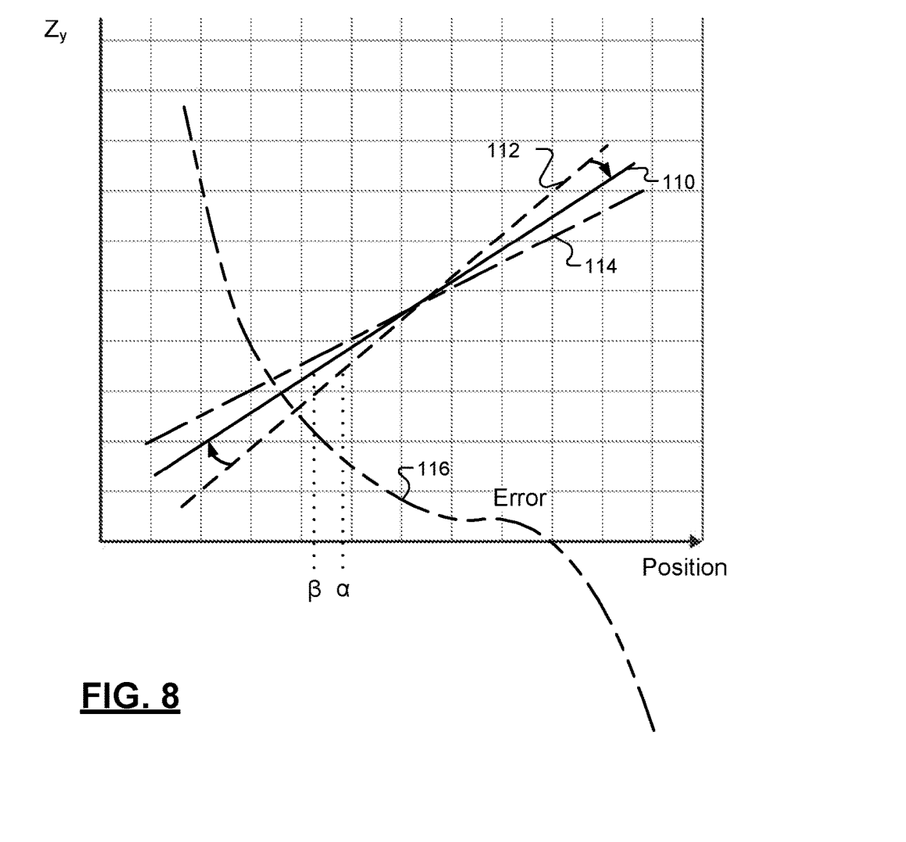
FIG. 8 is a diagrammatic representation of the position of a tuning element and a matching network versus the output impedance.

FIG. 8 is a graph of impedance $Z_y$ plotted with respect to position X of a variable reactance element, such as a load or tune capacitor. As can be seen from the linear plots, the solid line 110 indicates an ideal impedance $Z_y$ with respect to position. However, the actual impedance can vary within a range, as indicated by the plots 112, 114. Thus, for a given range of positions, such as between α and β, the impedance $Z_y$ can be the same at multiple positions. The variability in the relationship between position and impedance can impact the reproducibility of the matching network.

Reproducibility can be improved by characterizing the variable capacitors in the matching network, such as at the time of manufacturer. For example, the variable capacitors and the matching network can be modeled by the manufacture. The error 116, as shown in FIG. 8, can be determined, such as using a least squares approximation. The error 116 can be used as a correction and control in the matching network. In various examples, the correction can be linear or can be implemented using a lookup table.

Figure 9:
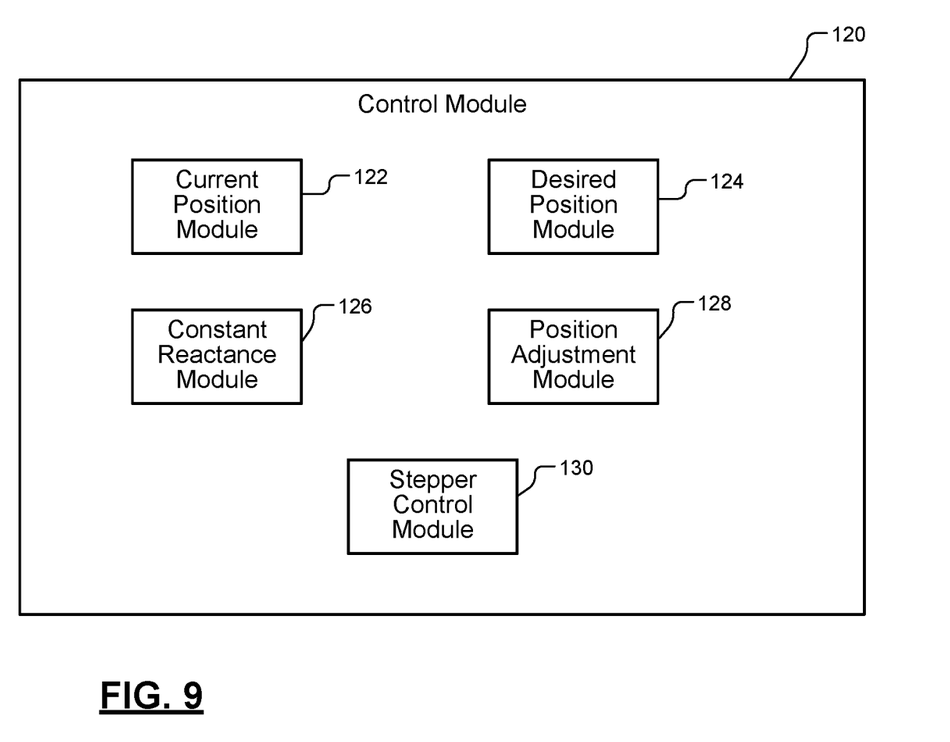
FIG. 9 is a functional block diagram of an example control module in accordance with various embodiments of the present disclosure.

FIG. 9 shows a control module 120. Control module or controller 56 of FIG. 3 may be implemented as control module 120. Control module 120 may include current positon module 122, desired position module 124, constant reaction module 126, position adjustment module 128, and stepper control module 130. In various embodiments, control module 120 includes a processor that executes code associated with the modules 122, 124, 126, 128, and 130. Operation of the modules 122, 124, 126, 128, and 130 is described below with respect to the method of FIG. 10.

Figure 10:
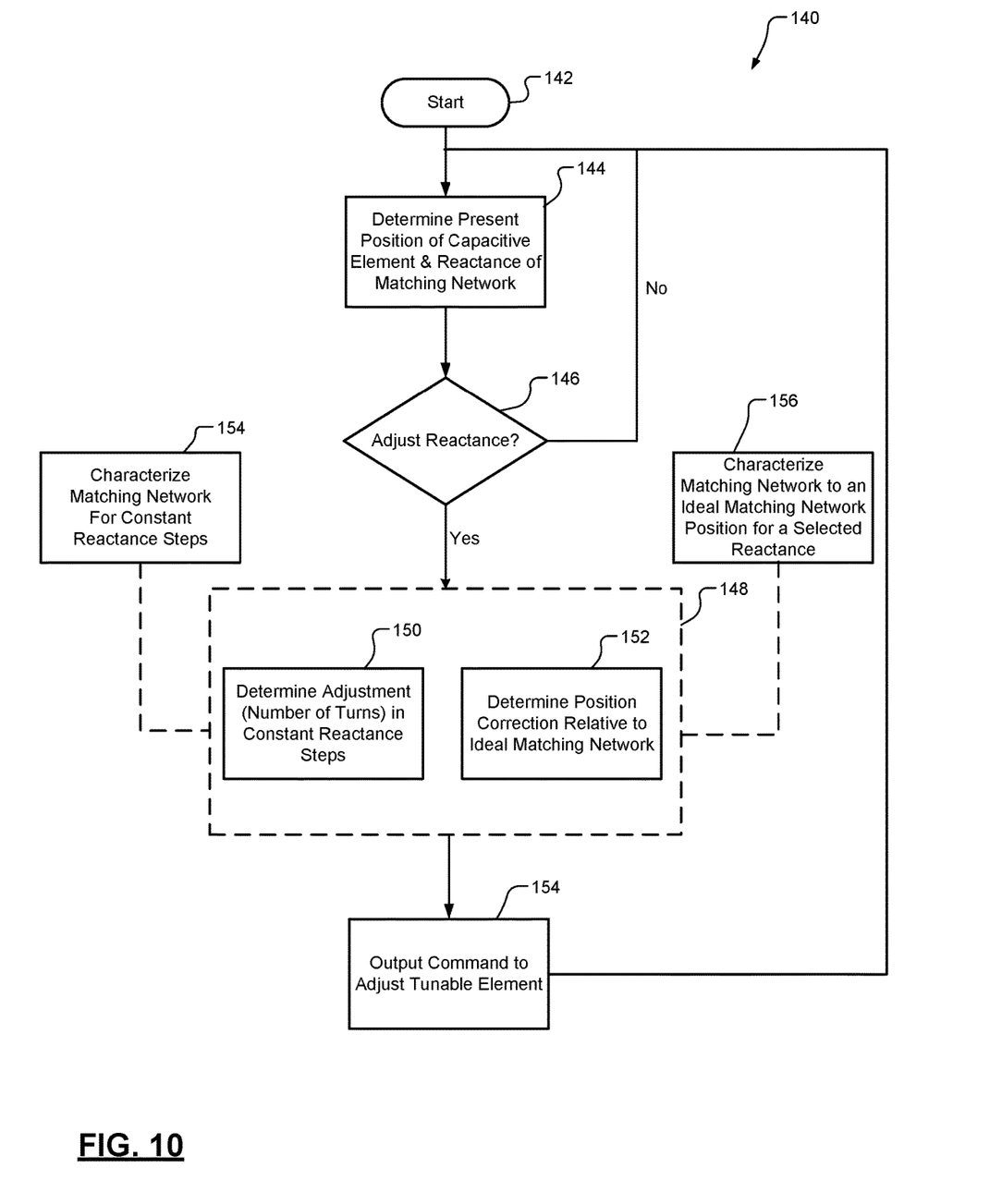
FIG. 10 is a flow chart control of a matching network according to various embodiments.

For further defined structure of the control module 56 of FIG. 3, see below provided method of FIG. 10 and the below provided definition for the term "module". The systems disclosed herein may be operated using numerous methods, an example RF control system method of which is illustrated in FIG. 10. Although the following operations are primarily described with respect to the implementations of FIG. 3, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 10 depicts a flowchart 140 of a multi-input, multi-output control system for controlling, by way of non-limiting example, matching networks 1, . . . , n of FIG. 3. The method begins at 142 in which various initiation and startup processes are executed and proceeds to 144. At 144, control module 120 determines the present position of a passive element of the matching network and the reactance of the matching network, such as any 1 of matching networks 54a, . . . , 54n of FIG. 3. Control proceeds to 146 in which it is determined whether adjustment of the matching network is necessary. If no adjustment is necessary, control proceeds to block 144 which again determines the present position of the passive element in the reactance of the matching network. If an adjustment is required, control proceeds to 148.

At 148, the matching network is adjusted to improve the repeatability and the reproducibility of the matching network. Regarding repeatability, at 150, controller 120 determines an adjustment of the position of passive element in the matching network, such as an adjustment occurring in constant reactance steps. The constant reactance steps improve the repeatability of the matching network. The constant reactance steps are determined as described above in connection with FIGS. 6 and 7. That is, controller 120 may include an association between a change in reactance and an adjustment in the capacitive element. For example, adjustment can be described with respect to the number of turns or partial turns of a stepper motor controlling the position of the capacitive element in the matching network. When determining the desired change in constant reactance steps at 150, controller 120 at 150 determines an adjustment in terms of reactance steps, not capacitance, adjustment.

In various embodiments, the association between the position of the variable reactance element of the matching network and the constant reactance steps is determined at 154. In various embodiments, 154 characterizes the matching network for the constant reactance steps by measuring reactance values and associating a position of the variable capacitive element in accordance with the reactance values. In various embodiments, characterization can occur during manufacture and/or assembly of the matching network to be characterized. The characterization can be represented in various configurations, including by equations to be executed at 150 or by a lookup table stored in memory 58.

In addition to adjusting to achieve repeatability, 148 also can improve the reproducibility of the matching network set operation of multiple matching networks, so that, for example, the variability between operation of matching networks 54*a*, . . . , 54*n* of FIG. 3 is minimized. At 152, once the desired, adjustment position of the matching network is determined based on reactance, the desired adjustment position can be modified or corrected in accordance with the error described at FIG. 8. The position error of matching network can be determined at 156 which characterizes the matching network for an ideal position for a selected reactance, as described with respect to FIG. 8. The error can be represented in various configurations, including by equations to be executed at 152 or by a lookup table stored in memory 58. One or both of the adjustments at 150, 152 can be for a new, commanded position for the capacitive element of the matching network. That is, the correction at 150 may or may not be applied to a new, commanded position of the variable capacitance of the matching network, the correction at 152 may or may not be applied to a new, commanded position of the variable capacitance of the matching network, or both the correction at 150 and the correction at 152 may or may not be applied to a new, commanded position of the variable capacitance of the matching network. Once an adjustment has been applied to a correction, controller 120 outputs a command to adjust the tenable element of the matching network. Control and returns to 144.

Various embodiments will advance the ability of semiconductor manufacturers to perform chamber matching. Chamber matching has been envisioned as a solution to solve productivity and yields for advanced nodes. For critical dimension (CD) and trench depth, 2 MHz and 13 MHz RF power couplings are identified as having significant impact on the process result. Semiconductor manufacturers can also apply the concepts of this disclosure in an RF power delivery system to achieve a more repeatable and reproducible RF power coupling. This will improve yields and tool uptime as semiconductor manufacturers are challenged to deliver RF power with greater precision.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A matching network for a radio frequency (RF) power delivery system, comprising:
at least one variable tuning element; and
a stepper motor configured to displace the variable tuning element,
wherein the stepper motor is further configured to adjust the variable tuning element so that each adjustment of the stepper motor is a number of steps that causes a constant change in a reactance of the matching network,
wherein a first adjustment includes a first number of steps and a second adjustment includes a second number of steps, and the first number of steps and the second number of steps are different.

2. The matching network of claim 1 wherein the variable tuning element is configured to be adjusted within predetermined bands of adjustment in accordance with a change in the reactance of the matching network with respect to the change in position and the predetermined bands define adjustment increments that result in the constant change in the reactance of the matching network for each adjustment.

3. The matching network of claim 2 wherein each band defines a predetermined number of turns of the stepper motor.

4. The matching network of claim 2 wherein a correction model is assigned to the matching network, wherein for a predetermined reactance of the matching network, a position correction is applied in accordance with the predetermined reactance.

5. The matching network of claim 1 wherein a correction model is applied to the matching network, wherein for a predetermined position of the variable tuning element, a position correction is applied to the predetermined position.

6. The matching network of claim 5 wherein the correction model is determined in accordance with a least squares approximation of a difference between a measured reactance and a predefined reactance for the matching network for selected positions of the variable tuning element.

7. The matching network of claim 1 wherein the variable tuning element comprises a capacitor disposed in one of a tuning leg or a load leg of the matching network.

8. A control system for a matching network, comprising:
a processor; and
a memory, wherein the memory stores instructions executable by the processor are configured to:
adjust a stepper motor to displace a variable tuning element,
wherein adjusting the stepper motor includes at least one of:
adjusting the variable tuning element according to an adjustment of the stepper motor is a number of steps that causing a constant change in a reactance of the matching network, wherein a first adjustment includes a first number of steps and a second adjustment includes a second number of steps, and the first number of steps and the second number of steps are different; or
defining correction model for the matching network, wherein for a predetermined reactance of the matching network, a position correction is applied in accordance with the predetermined reactance.

9. The matching network of claim 8 wherein the instructions are further configured to, when adjusting the variable tuning element according to the adjustment step of the stepper motor, adjust the variable tuning element within predetermined bands of adjustment in accordance with a change in reactance with respect to the change in position and the predetermined bands define adjustment increments that result in the constant change in the reactance of the matching network for each adjustment step.

10. The matching network of claim 9 wherein the instructions are further configured to define for each band a predetermined number of turns of the stepper motor.

11. The matching network of claim 8 wherein the variable tuning element is a capacitor disposed in one of a tuning leg or a load leg of the matching network.

12. A method for adjusting a matching network, comprising:
providing a stepper motor and adjusting the stepper motor to displacing a variable tuning element; and
determining a position of the variable tuning element according to at least one of:
each adjustment of the stepper motor is a number of steps that causes a constant change in a reactance of the matching network, wherein a first adjustment includes a first number of steps and a second adjustment includes a second number of steps, and the first number of steps and the second number of steps are different.

13. The method of claim 12 wherein when adjusting the variable tuning element so that each adjustment step of the stepper motor causes the constant change in the reactance of the matching network, adjusting the variable tuning element within predetermined bands of adjustment in accordance with a change in reactance with respect to the change in position, where the predetermined bands define adjustment increments that result in the constant change in the reactance for each step of adjustment.

14. The method of claim 13 wherein each band defines a predetermined number of turns of the stepper motor.

15. The method of claim 12 wherein the variable tuning element is a capacitor disposed in one of a tuning leg or a load leg of the matching network.

16. The method of claim 12 wherein the correction model is determined in accordance with a least squares approximation of a difference between a measured reactance and a predefined reactance for the matching network for selected positions of the variable tuning element.

17. A matching network system for a radio frequency (RF) power delivery system, comprising:
a matching network having a variable tuning element, the matching network configuring to introduce a varible impedance between a RF power generator and a load;
a stepper motor configured to adjust a position of the varible tuning element wherein the stepper motor is configured to adjust the varible tuning element so that each adjustment is a number of steps that results in a constant change in reactance of the matching network, wherein a first adjustment includes a first number of steps and a second adjustment includes a second number of steps, and the first number of steps and the second number of steps are different; and
a controller configured to communicate with the matching network, the controller configured to receive the position of the stepper motor, the controller configured to compare the position with a stored, predetermined position, the controller configured to generate a position correction and applying the position correction to the position.

18. The matching network of claim 17 wherein the constant change in reactance steps is determined by defining predetermined bands of adjustment in accordance with the constant change in the reactance of the matching network and assigning positions in accordance with the constant change in the reactance.

19. The matching network of claim 17 wherein the position correction is predetermined in accordance with a least squares approximation of a difference between a measured reactance and a predefined reactance for the matching network for selected positions of the variable tuning element.

* * * * *